United States Patent
Chin et al.

(10) Patent No.: US 10,772,194 B2
(45) Date of Patent: Sep. 8, 2020

(54) CIRCUIT BOARD, CIRCUIT ASSEMBLY, AND CIRCUIT BOARD MANUFACTURING METHOD

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventors: Tou Chin, Yokkaichi (JP); Arinobu Nakamura, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 25 days.

(21) Appl. No.: 16/088,207

(22) PCT Filed: Apr. 6, 2017

(86) PCT No.: PCT/JP2017/014405
§ 371 (c)(1),
(2) Date: Sep. 25, 2018

(87) PCT Pub. No.: WO2017/179489
PCT Pub. Date: Oct. 19, 2017

(65) Prior Publication Data
US 2019/0289711 A1    Sep. 19, 2019

(30) Foreign Application Priority Data

Apr. 15, 2016   (JP) .................................. 2016-082491

(51) Int. Cl.
| | |
|---|---|
| *H05K 7/00* | (2006.01) |
| *H05K 1/02* | (2006.01) |
| *H05K 1/14* | (2006.01) |
| *H05K 1/18* | (2006.01) |
| *H05K 3/20* | (2006.01) |

(52) U.S. Cl.
CPC ............ *H05K 1/0263* (2013.01); *H05K 1/02* (2013.01); *H05K 1/144* (2013.01); *H05K 1/18* (2013.01);
(Continued)

(58) Field of Classification Search
CPC ........ H05K 1/0263; H05K 1/144; H05K 1/18; H05K 2201/10272; H05K 2201/10295; H05K 3/202
See application file for complete search history.

(56) References Cited

U.S. PATENT DOCUMENTS 5,747,876 A  *  5/1998  Majumdar .............. H01L 23/24
257/687
6,320,748 B1 * 11/2001  Roden ................... H01L 23/367
165/185
(Continued)

FOREIGN PATENT DOCUMENTS

| JP | 2000-151061 A | 5/2000 |
| JP | 2003-164039 A | 6/2003 |

(Continued)

OTHER PUBLICATIONS

Jul. 4, 2017 International Search Report issued in International Patent Application No. PCT/JP2017/014405.

*Primary Examiner* — Yuriy Semenenko
(74) *Attorney, Agent, or Firm* — Oliff PLC (57) ABSTRACT

A circuit board that includes a substrate that has an upper surface on which a circuit pattern is formed, and a lower surface to which a plurality of bus bars that are spaced apart are fixed; a placement through hole that extends through the
(Continued)

upper surface and the lower surface and faces a bus bar of the plurality of bus bars and in which an electronic component is placed; and a terminal conductor foil that protrudes inward into the placement through hole from the lower surface and to which a terminal of the electronic component is connected.

7 Claims, 5 Drawing Sheets

(52) U.S. Cl.
CPC ... *H05K 3/202* (2013.01); *H05K 2201/10272* (2013.01); *H05K 2201/10295* (2013.01)

(56) References Cited

U.S. PATENT DOCUMENTS

| | | | | |
|---|---|---|---|---|
| 2003/0137813 | A1* | 7/2003 | Onizuka | H05K 1/0263 361/777 |
| 2004/0001319 | A1* | 1/2004 | Kawakita | H05K 1/0263 361/715 |
| 2005/0111166 | A1* | 5/2005 | Kita | B60R 16/0239 361/624 |
| 2008/0080151 | A1* | 4/2008 | Shimizu | H05K 1/0263 361/760 |
| 2008/0259586 | A1* | 10/2008 | Hosokawa | B60R 16/0239 361/813 |
| 2013/0223034 | A1* | 8/2013 | Rathburn | H01L 23/5383 361/767 |
| 2016/0242275 | A1* | 8/2016 | Nakamura | H05K 1/0263 |
| 2017/0047720 | A1* | 2/2017 | Kobayashi | H02G 3/16 |

FOREIGN PATENT DOCUMENTS

| | | |
|---|---|---|
| JP | 2003-164040 A | 6/2003 |
| JP | 2005-317908 A | 11/2005 |
| JP | 2010-110170 A | 5/2010 |
| JP | 2015-216754 A | 12/2015 |
| JP | 2015216754 | * 12/2015 |
| WO | 2006/073050 A1 | 7/2006 |

* cited by examiner

CIRCUIT BOARD, CIRCUIT ASSEMBLY, AND CIRCUIT BOARD MANUFACTURING METHOD

This application is the U.S. National Phase of PCT/JP2017/014405 filed Apr. 6, 2017, which claims priority from JP 2016-082491 filed Apr. 15, 2016, the entire disclosure of which is incorporated herein by reference.

BACKGROUND

The present disclosure relates to a circuit board, a circuit assembly, and a circuit board manufacturing method.

An automobile is equipped with an electric connection box (also called power distributor) that distributes electric power from a power supply (battery) to loads such as headlamps and windshield wipers. As a member that constitutes an internal circuit of the electric connection box, for example, a circuit assembly as disclosed in JP 2003-164040A can be used.

The circuit assembly includes: a control circuit board on which a conductor pattern (circuit pattern) has been formed; an input terminal bus bar and an output terminal bus bar that are bonded to the control circuit board; and a field effect transistor (FET: electronic component) that is mounted onto the control circuit board and the two bus bars. The FET includes a main body (package), a source terminal and a gate terminal that protrude from a side surface of the main body and extend downward, and a drain terminal that is provided on the back side of the main body. The drain terminal of the FET is electrically connected to the input terminal bus bar, and the source terminal is electrically connected to the output terminal bus bar. The gate terminal of the FET is formed by being bent at a position displaced upward relative to the source terminal by an amount corresponding to the thickness of the control circuit board, and is electrically connected to the conductor pattern of the control circuit board disposed on the output terminal bus bar (see FIG. 4).

SUMMARY

A circuit board according to the present disclosure includes a substrate that has an upper surface on which a circuit pattern is formed, and a lower surface to which a plurality of bus bars that are spaced apart are fixed, a placement through hole that extends through the upper surface and the lower surface and faces a bus bar of the plurality of bus bars and in which an electronic component is placed; and a terminal conductor foil that protrudes inward into the placement through hole from the lower surface and to which a terminal of the electronic component is connected.

A circuit assembly according to the present disclosure includes: a circuit board that has an upper surface on which a circuit pattern is formed; a plurality of bus bars that are connected to the circuit board, the plurality of bus bars being spaced apart and fixed to a lower surface of the circuit board; and an electronic component that is placed on a bus bar of the plurality of bus bars. The circuit board includes: a placement through hole that extends through the upper surface and the lower surface and faces the bus bar, and in which the electronic component is placed; and a terminal conductor foil that protrudes inward into the placement through hole from the lower surface and to which a terminal of the electronic component is connected.

A first circuit board manufacturing method according to the present disclosure includes: preparing a stacked plate that has upper and lower surfaces on each of which a conductor foil is stacked; and performing hole forming processing on the stacked plate so as to form a through hole that extends through the upper and lower surfaces. In the hole forming processing, a protrusion that protrudes inward into the through hole from the lower surface is formed by causing a portion of the conductor foil on the lower surface of the stacked plate to remain in the through hole.

A second circuit board manufacturing method according to the present disclosure includes: preparing a perforated stacked plate that has an upper surface on which a conductor foil is stacked, and a through hole that extends through upper and lower surfaces of the perforated stacked plate; a bonding a conductor foil to the lower surface of the perforated stacked plate so as to cover the through hole; and melting and removing a portion of the conductor foil that covers the through hole, and thereby forming a protrusion that protrudes inward into the through hole from the lower surface.

DETAILED DESCRIPTION OF EMBODIMENTS

With the electronic component described above, in order to electrically connect the source terminal and the gate terminal to the bus bar and the circuit pattern on the circuit board, respectively, as described above, the source terminal and the gate terminal are disposed such that they are spaced apart in the vertical direction by an amount corresponding to the height difference therebetween. The displacement between the source terminal and the gate terminal in the vertical direction can be formed by performing an operation of bending the gate terminal or the like, but such an operation is troublesome. When the gate terminal is long, the terminal is easily bent. However, particularly when the gate terminal is short, it is difficult to bend the terminal, and in a leadless electronic component in which terminals are provided on the lower surface of the package, there is no terminal that can be bent. Accordingly, it may be difficult to mount the terminals onto a circuit board.

Accordingly, an exemplary aspect of the disclosure provides a circuit board on which an electronic component is easily mounted.

An exemplary aspect of the disclosure also provides a circuit assembly that includes the circuit board.

Furthermore, an exemplary aspect of the disclosure also provides a circuit board manufacturing method for manufacturing the circuit board.

Advantageous Effects of Disclosure

An electronic component is easily mounted onto the circuit board according to the present disclosure.

The circuit assembly according to the present disclosure is easily mounted onto a circuit board of an electronic component.

With the first circuit board manufacturing method according to the present disclosure, and the second circuit board manufacturing method according to the present disclosure, it is possible to manufacture a circuit board on which an electronic component is easily mounted.

Description of Embodiments

First, embodiments according to the present disclosure are listed and described.

(1) A circuit board according to one embodiment of the present disclosure is a circuit board that has an upper surface on which a circuit pattern is formed, and a lower surface to which a plurality of bus bars that are spaced apart are fixed, the circuit board including: a placement through hole that extends through the upper surface and the lower surface and faces the bus bar, and in which an electronic component is placed; and a terminal conductor foil that protrudes inward into the placement through hole from the lower surface and to which a terminal of the electronic component is connected.

With the configuration described above, because the circuit board includes, on its lower surface, the terminal conductor foil that protrudes toward the inside of the placement through hole from the lower surface, the electronic component can be easily mounted. Also, because it is not necessary to connect the terminal of the electronic component directly to the circuit pattern provided on the upper surface of the circuit board, there is no need to bend the terminal of the electronic component in consideration of the thickness of the circuit board, and it is possible to eliminate the need for an operation of bending or the like. Because it is not necessary to bend the terminal, not only an electronic component that has short terminals, but also a leadless electronic component in which terminals are provided on the lower surface of the package can be easily mounted onto the circuit board via the terminal conductor foil.

(2) A circuit assembly according to one embodiment of the present disclosure includes: a circuit board that has an upper surface on which a circuit pattern is formed; a plurality of bus bars that are connected to the circuit board, the bus bars being spaced apart and fixed to a lower surface of the circuit board; and an electronic component that is placed on the bus bar. The circuit board includes: a placement through hole that extends through the upper surface and the lower surface and faces the bus bar, and in which the electronic component is placed; and a terminal conductor foil that protrudes inward into the placement through hole from the lower surface and to which a terminal of the electronic component is connected.

With the configuration described above, because the circuit assembly includes the circuit board described above, the electronic component can be easily mounted onto the circuit board.

(3) As an embodiment of the circuit assembly, the bus bars may include a bus bar recess portion that reduces a height difference between an upper surface of the bus bars and an upper surface of the terminal conductor foil on the upper surface of the bus bars as a result of the terminal conductor foil being fitted.

With the configuration described above, the height difference between the upper surface of the terminal conductor foil and the upper surface of the bus bars is likely to be reduced.

(4) As an embodiment of the circuit assembly, the terminal conductor foil may include a conductor foil recess portion that reduces a height difference between an upper surface of the bus bars and an upper surface of the terminal conductor foil, the conductor foil recess portion being formed by depressing, toward the lower surface, a bonding region in the upper surface of the terminal conductor foil to which the terminal of the electronic component is bonded.

With the configuration described above, the height difference between the upper surface of the terminal conductor foil and the upper surface of the bus bars can be substantially eliminated, and the upper surface of the terminal conductor foil and the upper surface of the bus bars can be easily made substantially flush with each other. Accordingly, the electronic component can be mounted onto the terminal conductor foil and the bus bars without inclining the electronic component.

(5) As an embodiment of the circuit assembly, the bus bars may include a bus bar projection portion that reduces a height difference between an upper surface of the bus bars and an upper surface of the terminal conductor foil, the bus bar projection portion being formed so as to locally protrude toward the upper surface in a region in the upper surface of the bus bars that faces the placement through hole.

With the configuration described above, the height difference between the upper surface of the terminal conductor foil and the upper surface of the bus bars can be substantially eliminated, and the upper surface of the terminal conductor foil and the upper surface of the bus bars can be easily made substantially flush with each other. Accordingly, the electronic component can be mounted onto the terminal conductor foil and the bus bars without inclining the electronic component.

(6) A first circuit board manufacturing method according to one aspect of the present disclosure includes: a preparation step of preparing a stacked plate that has upper and lower surfaces on each of which a conductor foil is stacked; and a hole forming processing step of performing hole forming processing on the stacked plate so as to form a through hole that extends through the upper and lower surfaces. In the hole forming processing, a protruding portion (i.e., protrusion) that protrudes inward into the through hole from the lower surface is formed by causing a portion of the conductor foil on the lower surface of the stacked plate to remain in the through hole.

With the configuration described above, it is possible to form a circuit board that includes the placement through hole and the terminal conductor foil. Also, because the protruding portion is formed unitarily with the stacked plate, it is not necessary to separately prepare a thin piece made of a conductive material, and it is possible to eliminate the need for an operation of connecting, with solder or the like, a thin piece to a land that is provided on the circuit board.

(7) A second circuit board manufacturing method according to one aspect of the present disclosure includes: a preparation step of preparing a perforated stacked plate that has an upper surface on which a conductor foil is stacked, and a through hole that extends through upper and lower surfaces of the perforated stacked plate; a bonding step of bonding a conductor foil to the lower surface of the perforated stacked plate so as to cover the through hole; and a removing step of melting and removing a portion of the conductor foil that covers the through hole, and thereby forming a protruding portion that protrudes inward into the through hole from the lower surface.

With the configuration described above, as with the first circuit board manufacturing method described above, it is possible to form a circuit board that includes the placement through hole and the terminal conductor foil. Also, it is unnecessary to separately prepare a thin piece made of a conductive material, and it is possible to eliminate the need for an operation of connecting, with solder or the like, a thin piece to a land that is provided on the circuit board.

Detailed Description of Embodiments

The embodiments according to the present disclosure will be described in detail below with reference to the drawings. In the drawings, the same reference numerals indicate the same elements.

Embodiment 1

Circuit Assembly

A circuit assembly 1A according to Embodiment 1 will be described with reference to FIGS. 1 to 3. The circuit assembly 1A includes: a circuit board 2 that has an upper surface on which a front-side circuit pattern 2A (in which the markings of the circuit pattern are not shown) is formed; a plurality of bus bars 3 that are fixed to a lower surface of the circuit board 2; and an electronic component 4 that is placed on the bus bars 3. A feature of the circuit assembly 1A is that the circuit board 2 includes: a placement through hole 22 in which the electronic component 4 is placed; and a terminal conductor foil 24 that protrudes toward the inside of the placement through hole 22 from the lower surface. A detailed description will be given below. In the following description, for the sake of convenience of the description, the side of the circuit board 2 on which the bus bars 3 are provided is defined as "down", and the opposite side is defined as "up".

Circuit Board

Figure 1:
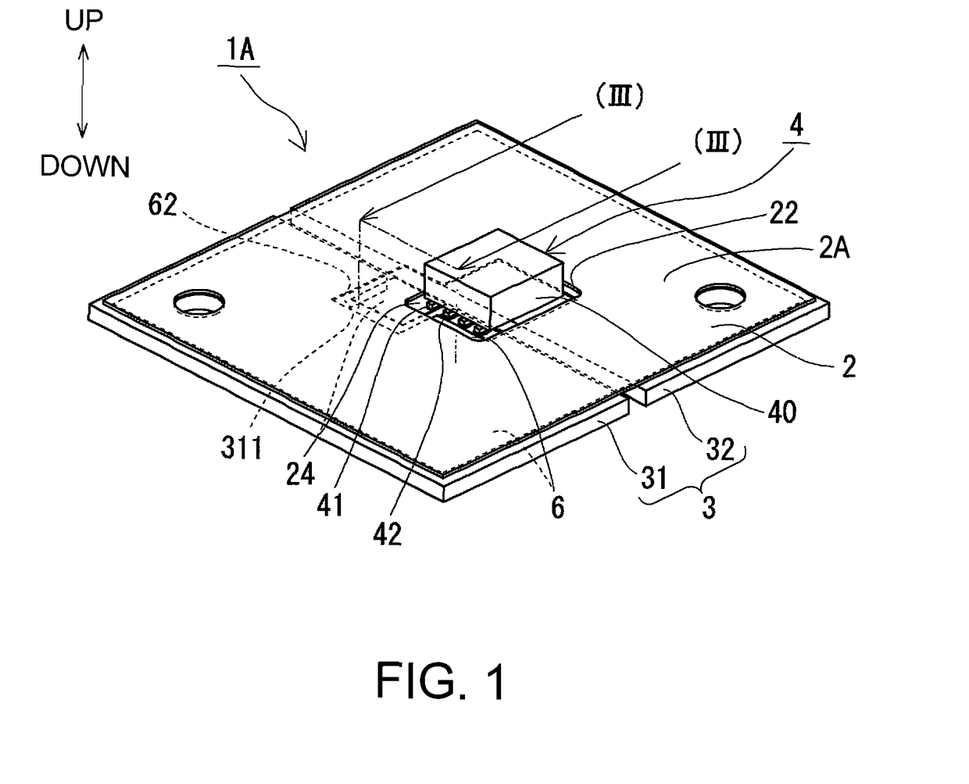
FIG. 1 is a schematic perspective view of a circuit assembly according to Embodiment 1.
Figure 2:
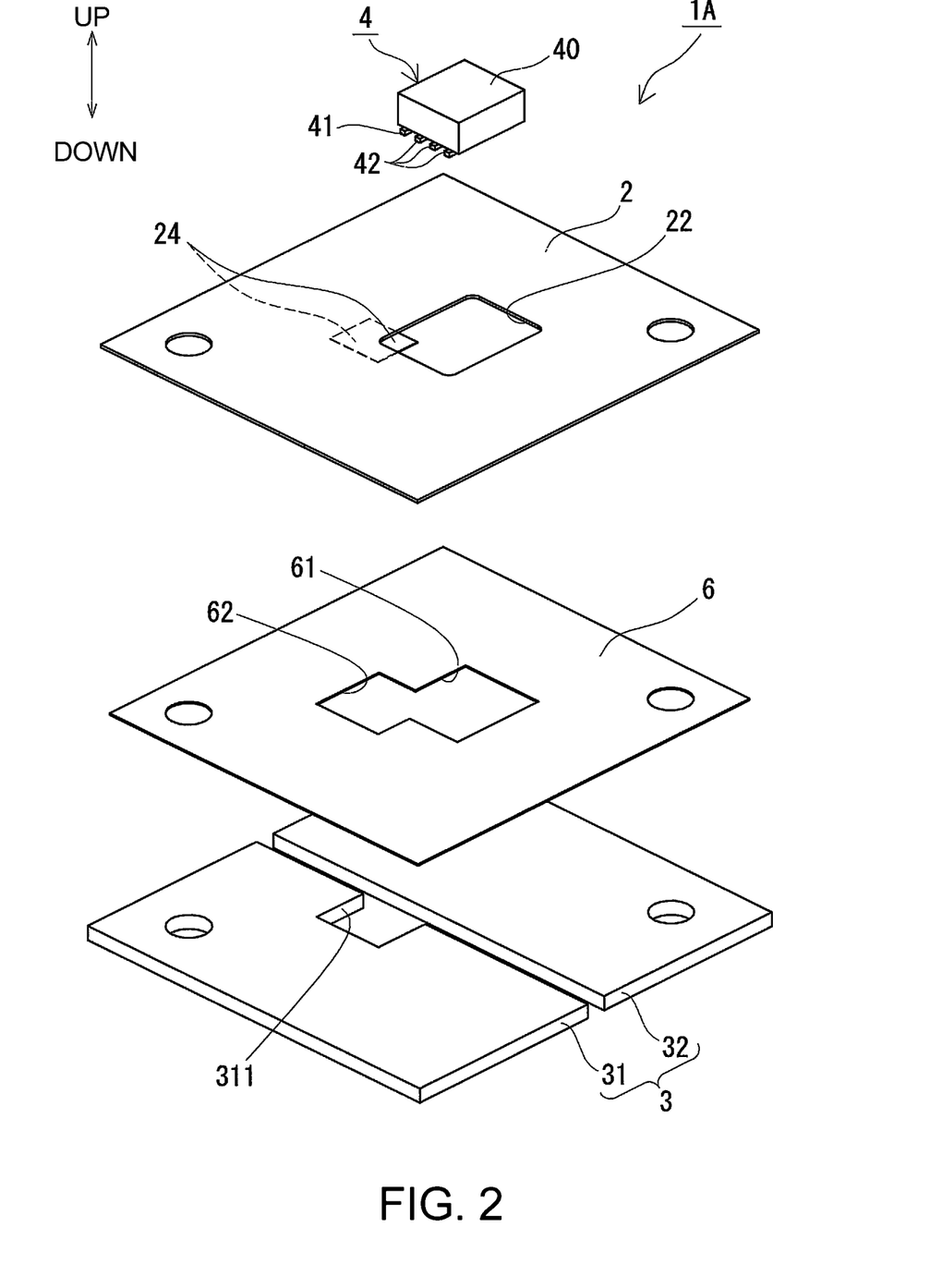
FIG. 2 is a schematic exploded perspective view of the circuit assembly according to Embodiment 1.
Figure 3:
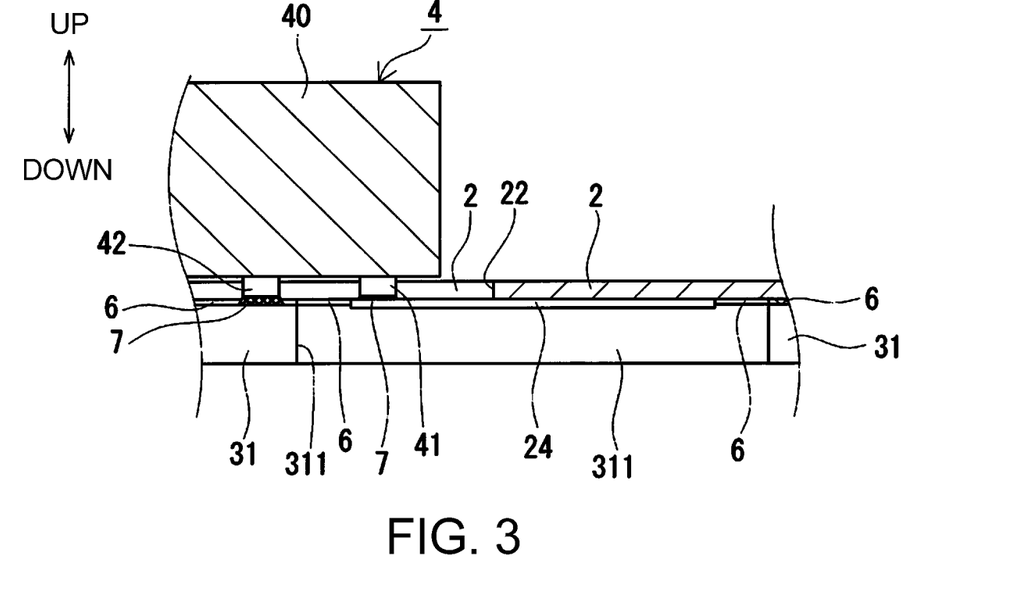
FIG. 3 is a cross sectional view of the circuit assembly shown in FIG. 1, taken along the cutting line (III)-(III) shown in FIG. 1.

The circuit board 2 is a plate-like member on which the electronic component 4 is mounted, and includes a placement through hole 22 in which the electronic component 4 is placed (FIGS. 1 to 3). The circuit board 2 includes an insulating substrate, and a front-side circuit pattern that is formed on one side (upper surface) of the insulating substrate. The circuit board 2 also includes a terminal conductor foil 24, which will be described later, on the other side (lower surface) of the insulating substrate. Where necessary, a back-side circuit pattern that is connected to the terminal conductor foil 24 may be formed on the lower surface. As the circuit board 2, a printed circuit board can be used. The front-side circuit pattern is made of a copper foil. The bus bars 3 are fixed to the other side (lower surface) of the insulating substrate.

Placement Through Hole

The placement through hole 22 is a hole for placing the electronic component 4 on the bus bars 3. The placement through hole 22 extends through the upper and lower surfaces and faces two adjacent bus bars 31 and 32. The placement through hole 22 has a contour that conforms to the outer shape of the electronic component 4. In this example, the contour is rectangular. The size of the placement through hole 22 is larger than that of the electronic component 4 as viewed in a plan view.

Terminal Conductor Foil

The terminal conductor foil 24 is electrically and mechanically connected to a terminal of the electronic component 4. The terminal conductor foil 24 protrudes toward the inside of the placement through hole 22 from the lower surface. That is, the terminal conductor foil 24 covers a portion of the placement through hole 22. The terminal conductor foil 24 is formed unitarily with the insulating substrate by the material constituting the insulating substrate, rather than being bonded with solder to a land that is provided on the lower surface of the insulating substrate. Accordingly, it is not necessary to separately prepare a thin piece (lead) made of a conductive material, and it is possible to eliminate the need for an operation of connecting, with solder or the like, a thin piece to a land that is provided on the lower surface of the circuit board 2. The material of the terminal conductor foil 24 may be copper, as with the front-side circuit pattern. The terminal conductor foil 24 may have a thickness of, for example, at least 35 µm and at most 400 µm. When the terminal conductor foil 24 has a thickness of at least 35 µm, it is easy to provide a strength enough for a terminal of the electronic component 4 to be connected. When the terminal conductor foil 24 has a thickness of at most 400 µm, the terminal conductor foil 24 will not be too thick, and thus the total thickness of the circuit board 2 will not be too thick. The thickness of the terminal conductor foil 24 is preferably at least 50 µm and at most 300 µm, and more preferably at least 70 µm and at most 200 µm.

Bus Bar

The bus bars 3 are part of an electric power circuit (FIGS. 1 to 3). The bus bars 3 are connected to a power supply and an electric load. The material of the bus bars 3 may be an electroconductive metal. Specific examples include copper, a copper alloy, and the like. The plurality of bus bars 3 (31 and 32) are spaced apart and fixed to the other side (lower surface) of the circuit board 2 (FIG. 2). The plurality of bus bars 3 can be fixed to the circuit board 2 by using an adhesive sheet 6 (described later) that is interposed therebetween. The bus bars 31 and 32 have a rectangular shape. The upper surfaces of the two adjacent bus bars 31 and 32 are flush with each other.

The first bus bar 31 may have, on its upper surface, a bus bar recess portion into which the terminal conductor foil 24 is fitted. As used herein, the expression "the terminal conductor foil 24 is fitted" may encompass a state in which the terminal conductor foil 24 in the thickness direction is entirely housed in the bus bar recess portion, and may also encompass a state in which the lower surface side of the terminal conductor foil 24 is housed in the bus bar recess portion, with the upper surface side thereof being not housed in the bus bar recess portion. The bus bar recess portion reduces the height difference between the upper surfaces (a region that faces the placement through hole 22) of the bus bars 31 and 32 and the upper surface of the terminal conductor foil 24. The bus bar recess portion may be formed by any of cutting-out, punching, and thinning as long as a depressed area can be formed from the circuit board 2 side to the opposite side. In this example, the bus bar recess portion is formed by a bus bar cutout portion 311.

The size of the bus bar cutout portion 311 is larger than that of the terminal conductor foil 24 that overlaps the bus bar cutout portion 311 (FIGS. 1 to 3). The bus bar cutout portion 311 is formed such that the bus bar cutout portion 311 overlaps a first terminal 41, but does not overlap a second terminal 42, and an internal circumference that forms the bus bar cutout portion 311 is positioned between the first terminal 41 and the second terminal 42. The formation region of the bus bar cutout portion 311 in the vertical direction extends entirely from top to bottom of the first bus bar 31. That is, the bus bar cutout portion 311 is formed by cutting out the entire region of the bus bar 31 in the thickness direction.

Electronic Component

The electronic component 4 is mounted on both the back-side circuit pattern (the terminal conductor foil 24) on the lower surface of the circuit board 2 and the bus bars 3 (FIGS. 1 to 3). The electronic component 4 may be, for example, a switching element such as a relay or a field effect transistor (FET).

The electronic component 4 includes a package 40 that is placed on the bus bars 3, and terminals that are arranged on the lower surface of the package 40. As a result of the electronic component 4 having terminals on the lower surface of the package 40, the terminal length can be shortened. Accordingly, the electric resistance of the terminal can be reduced, and low power loss tends to be achieved. In addition, the distance between the terminals and the bus bars 3 can be shortened, and heat dissipation properties tend to be improved. The terminals that are arranged on the lower surface of the package 40 may be arranged within the contour of the lower surface, or may be arranged so as to extend from the inside of the contour of the lower surface and to beyond the contour of the lower surface. A plurality of terminals may be arranged on the lower surface of the package 40. In the case where a plurality of terminals are arranged on the lower surface of the package 40, the plurality of terminals may be of one type, or may be of different types. The electronic component 4 may have, in addition to the terminals that are arranged on the lower surface of the package 40, a terminal that is arranged on a side (side surface) other than the lower surface.

In this example, the electronic component 4 includes three types of terminals: a first terminal 41, a second terminal 42, and a third terminal (not shown) that are arranged on the lower surface of the package 40. The first terminal 41, the second terminal 42, and the third terminal are provided on the same plane. An FET is used as the electronic component 4. The first terminal 41 of the FET shown in FIG. 1 is a gate terminal, and only one first terminal is provided. The second terminal 42 is a source terminal, and three second terminals are provided. The third terminal is a drain terminal, and is made of a back side pattern of the package 40. The one first terminal 41 and the three second terminals 42 are provided unitarily with the package 40 on the same side of the package 40, and the third terminal is provided unitarily with the package 40 on the side opposite to the first terminal 41 and the second terminal 42 across the insulating material on the back side of the package 40. The package 40 straddles the spacing between the bus bars 31 and 32, which are adjacent to each other. The one first terminal 41 is electrically and mechanically connected to the terminal conductor foil 24 (FIGS. 1 and 3). The three second terminals 42 are electrically and mechanically connected to the first bus bar 31. The third terminal is electrically and mechanically connected to the second bus bar 32 that is a bus bar different from the bus bar to which the second terminals 42 are connected.

To implement the electric and mechanical connection, it is possible to use a metal connection material, typically solder 7 (FIG. 3). The connection using solder 7 can be performed by a reflow method. That is, for example, a solder paste is applied to predetermined positions in advance before the electronic component 4 is placed on the terminal conductor foil 24 and the bus bars 31 and 32. Then, the electronic component 4 is placed on the solder paste, and thereafter heated so as to connect the electronic component 4 to the terminal conductor foil 24 and the bus bars 31 and 32. In this way, the connection of the terminal conductor foil 24 (the circuit board 2) to the bus bars 3 and the electronic component 4 can be performed by reflowing solder 7, and thus excellent connection operation efficiency of connecting the terminal conductor foil 24 to the bus bars 3 to the electronic component 4 is obtained. At the time of connection, even if the upper surface of the terminal conductor foil 24 is not flush with the upper surfaces of the bus bars 31 and 32, the height difference between the upper surface of the terminal conductor foil 24 and the upper surfaces of the bus bars 31 and 32 can be absorbed by the solder 7 as long as the height difference is small.

Adhesive Sheet

The adhesive sheet 6 bonds the circuit board 2 and the plurality of bus bars 3 (FIGS. 1 to 3). The adhesive sheet 6 is placed continuously so as to straddle the two bus bars 31 and 32 on the upper surfaces of the two bus bars 31 and 32.

In the adhesive sheet 6, a component opening portion 61 is formed. The component opening portion 61 is formed in an overlapping area that overlaps with the electronic component 4 such that it is possible to electrically and mechanically connect the terminal of the electronic component 4 to the terminal conductor foil 24 and the two bus bars 31 and 32. The component opening portion 61 has a contour that conforms to the outer shape of the electronic component 4. In this example, the contour is rectangular. The size of the component opening portion 61 is larger than that of the electronic component 4 as viewed in a plan view.

A conductor foil opening portion 62 may be formed in the adhesive sheet 6. With this configuration, the height difference between the region that faces the placement through hole 22, which is formed in the upper surfaces of the two bus bars 31 and 32, and the upper surface of the terminal conductor foil 24 tends to be reduced. Particularly when the bus bar 31 includes the bus bar cutout portion 311 (bus bar recess portion), this configuration is effective to reduce the height difference described above. The conductor foil opening portion 62 is formed in an overlapping area that overlaps with the terminal conductor foil 24 (the bus bar cutout portion 311). The conductor foil opening portion 62 has a contour that conforms to the outer shape of the terminal conductor foil 24. In this example, the contour is rectangular. The size of the conductor foil opening portion 62 is larger than that of the terminal conductor foil 24 as viewed in a plan view. The conductor foil opening portion 62 and the component opening portion 61 are formed continuously such that their corner portions overlap.

The adhesive sheet 6 has a thickness of, for example, at least 30 μm and at most 150 μm. When the adhesive sheet 6 has a thickness of at least 30 μm, the bonding properties and insulation properties between the circuit board 2 and the plurality of bus bars 3 tend to be increased. When the adhesive sheet 6 has a thickness of at most 150 μm, the adhesive sheet 6 will not be too thick, and thus the height difference between the upper surfaces of the bus bars 31 and 32 and the upper surface of the terminal conductor foil 24 tends to be reduced. More preferably, the adhesive sheet 6 has a thickness of at least 40 μm and at most 100 μm.

The constituent material of the adhesive sheet 6 may be a resin that has electric insulation properties and is heat resistant to the solder reflow temperature when mounting the electronic component 4. The constituent material of the adhesive sheet 6 may be, for example, a high-heat resistant acrylic pressure-sensitive adhesive, or an insulating adhesive such as an epoxy resin adhesive.

Applications

The circuit assembly 1A according to Embodiment 1 is suitable for use in an automobile electric connection box. Also, the circuit assembly 1A according to Embodiment 1 is suitable for use as a high current power circuit board in a direct current voltage converting apparatus, an AC/DC converting apparatus, or a DC/AC inverter. The circuit board 2 included in the circuit assembly 1A according to Embodiment 1 is suitable for use in a circuit assembly that constitutes an internal circuit of an automobile electric connection box.

Operations and Advantageous Effects

The circuit assembly 1A according to Embodiment 1 can provide the following advantageous effects.

(1) The electronic component 4 can be easily mounted onto the circuit board 2. Because the circuit board 2 includes, on its lower surface, the terminal conductor foil 24 that protrudes toward the placement through hole 22, it is not necessary to connect the terminals of the electronic component 4 directly to the front-side circuit pattern of the circuit board 2. For this reason, there is no need to bend the terminals in consideration of the thickness of the circuit board 2, and it is possible to eliminate the need for an operation of bending or the like. Because it is not necessary to bend the terminals, the electronic component 4 that has short terminals, and even for example, a leadless electronic component in which terminals are provided on the lower surface of the package 40 can be easily mounted onto the circuit board 2.

(2) Low power loss tends to be achieved. This is because, as described above, even an electronic component 4 (leadless electronic component) that has short terminals can be easily mounted onto the circuit board 2, and the electric resistance of the terminal can be reduced.

(3) Heat dissipation properties tend to be improved. This is because, as described above, even an electronic component 4 (leadless electronic component) that has short terminals can be easily mounted onto the circuit board 2, and the distance between the terminals and the bus bars 3 can be shortened.

(4) Excellent productivity is attained. This is because the circuit board 2 and the bus bars 3 can be bonded by using the adhesive sheet 6, these members can be unitarily fixed by simply stacking them, and excellent assembling operation efficiency is attained.

(5) The height difference between the upper surfaces of the bus bars 31 and 32 and the upper surface of the terminal conductor foil 24 tends to be reduced. This is because the first bus bar 31 includes the bus bar cutout portion 311 into which the terminal conductor foil 24, to which the first terminal 41 is connected, is fitted. Accordingly, the electronic component 4 can be mounted onto the terminal conductor foil 24 and the bus bars 31 and 32, with a small inclination of the electronic component 4.

Circuit Board Manufacturing Method

A circuit board 2 can be manufactured using a circuit board manufacturing method I that includes a preparation step and a hole forming processing step, or a circuit board manufacturing method II that includes a preparation step, a bonding step, and a removing step.

Manufacturing Method I

Preparation Step

In the preparation step, a stacked plate is prepared that has upper and lower surfaces on each of which a conductor foil is stacked. The stacked plate includes an insulating substrate, a conductor foil provided on the upper surface of the insulating substrate, and a conductor foil provided on the lower surface of the insulating substrate.

Hole Forming Processing Step

In the hole forming processing step, hole forming processing is performed on the stacked plate. In the hole forming processing, a through hole is formed that extends through the stacked plate in the vertical direction, and a protruding portion is formed that is a portion of the conductor foil provided on the lower surface in the stacked plate and that protrudes toward the inside of the through hole from the lower surface. That is, two regions are formed: a region perforated through the stacked plate; and a region from which the upper surface-side conductor foil and the insulating substrate have been removed, with a portion of the lower surface-side conductor foil being left. The through hole constitutes the placement through hole 22, and the protruding portion constitutes the terminal conductor foil 24. The hole forming processing may be, for example, machining processing, laser processing, or the like. The hole forming processing may be a combination of machining processing and laser processing. In the case where machining processing and laser processing are combined, for example, machining processing is performed for rough work, and laser processing is performed for finishing work.

Manufacturing Method II

Preparation Step

In the preparation step, a perforated stacked plate is prepared that has an upper surface on which a conductor foil is stacked, and a through hole that extends through the upper and lower surfaces thereof. The perforated stacked plate includes an insulating substrate, and a conductor foil that is provided on the upper surface of the insulating substrate. A conductor foil is not provided on the lower surface of the insulating substrate.

Bonding Step

In the bonding step, a conductor foil is bonded to the lower surface of the perforated stacked plate so as to cover the through hole of the stacked plate. To bond the conductor foil, for example, it is possible to use a bonding sheet such as an insulating prepreg obtained by impregnating a glass cloth (glass fiber) with a resin (for example, an epoxy resin or the like). In the bonding sheet, a through hole that has the same shape and the same size as those of the through hole of the perforated stacked plate is preferably formed in advance in an area that corresponds to the through hole of the perforated stacked plate.

Removing Step

In the removing step, a portion of the conductor foil that covers the through hole is melted and removed. With this configuration, a protruding portion that protrudes toward the inside of the through hole of the perforated stacked plate from the lower surface of the perforated stacked plate is formed. The protruding portion constitutes the terminal conductor foil 24 which was described above. The melting and removal of the conductor foil can be performed by, for example, etching. At this time, masking is performed on the upper and lower surfaces of the conductor foil that need to be left. The masking may be performed in advance in the bonding step described above before a conductor foil is bonded to the perforated stacked plate. That is, a conductor foil in which masking has been performed at a predetermined position may be bonded to the perforated stacked plate. In the case where, in addition to the terminal conductor foil 24, a back-side circuit pattern is formed on the lower surface of the circuit board 2, the terminal conductor foil 24 and the back-side circuit pattern can be formed simultaneously through the removing step.

Applications

The circuit board manufacturing methods according to Embodiment 1 are suitable for manufacturing the circuit board described above.

Operations and Advantageous Effects

With the circuit board manufacturing methods I and II according to Embodiment 1, it is possible to easily manufacture the circuit board 2 that includes, on the lower surface of the insulating substrate, the terminal conductor foil 24 that protrudes toward the placement through hole 22. Also, it is possible to manufacture the circuit board 2 that has excellent positional accuracy of the terminal conductor foil 24. This is because the terminal conductor foil 24 is not a terminal conductor foil formed by soldering leads to lands on the circuit board 2, and thus a positional offset does not occur during soldering.

Embodiment 2

Circuit Assembly

Figure 4:
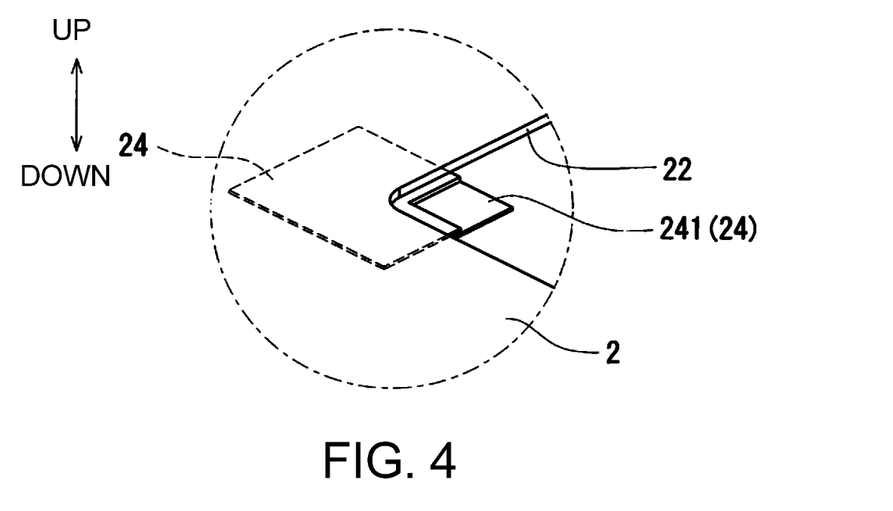
FIG. 4 is a partially enlarged perspective view of a terminal conductor foil included in a circuit assembly according to Embodiment 2.
Figure 5:
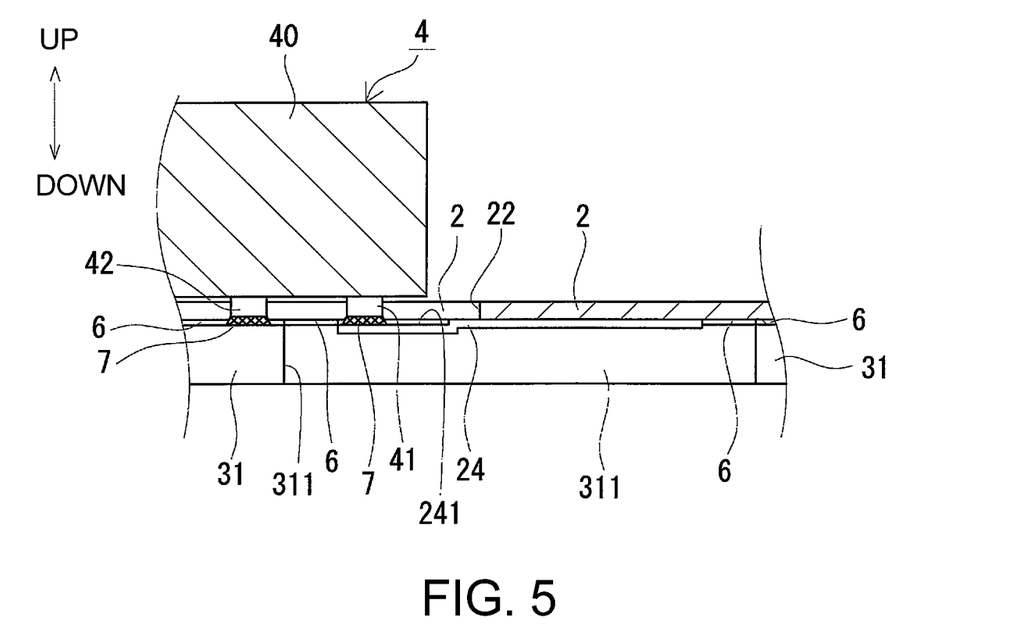
FIG. 5 is a partial cross sectional view of the circuit assembly according to Embodiment 2, taken along a cutting line that divides two adjacent bus bars.

A circuit assembly according to Embodiment 2 will be described with reference to FIGS. 4 and 5. The circuit assembly according to Embodiment 2 is different from the circuit assembly 1A according to Embodiment 1 in that the terminal conductor foil 24 includes a conductor foil recess portion 241. Other than this, the circuit assembly according to Embodiment 2 has the same configuration as that of the circuit assembly according to Embodiment 1. The following description will be given focusing on the difference, and a description of the same constituent elements and the same advantageous effects will be omitted. This also applies to Embodiment 3 and Variation 1 given below. FIG. 4 is an enlarged view of the terminal conductor foil 24. For the sake of convenience of the description, other members such as the first bus bar 31 are omitted. FIG. 5 is a cross sectional view of the circuit assembly, taken along a cutting line that divides two adjacent bus bars, as in FIG. 3.

Circuit Board

Terminal Conductor Foil

The conductor foil recess portion 241 of the terminal conductor foil 24 reduces the height difference between the upper surface of the terminal conductor foil 24 and the upper surface of the bus bars 3 (31 and 32) in the vertical direction. The conductor foil recess portion 241 is formed such that a bonding region in the upper surface of the terminal conductor foil 24. to which the first terminal 41 of the electronic component 4 is bonded, is depressed toward the lower surface of the terminal conductor foil 24. That is, the conductor foil recess portion 241 is formed in a region that faces the placement through hole 22. The depth (the length extending in the vertical direction) of the conductor foil recess portion 241 may be set to the same value as the thickness of the adhesive sheet 6. With this configuration, the upper surface of the terminal conductor foil 24 and the upper surface of the bus bars 3 (31 and 32) can be easily made substantially flush with each other. The conductor foil recess portion 241 can be formed by punching from its upper surface side toward its lower surface side using a punch. Alternatively, the conductor foil recess portion 241 can be formed by machining processing, or locally etching the terminal conductor foil 24 in the thickness direction of the terminal conductor foil 24.

Other Considerations

In addition to the terminal conductor foil 24, a back-side circuit pattern may be formed on the lower surface of the circuit board 2. That is, a back-side circuit pattern may be interposed between the lower surface of the circuit board 2 and the adhesive sheet 6. In this case, the depth of the conductor foil recess portion 241 may be set to the same value as the total thickness of the thickness of the adhesive sheet 6 and the thickness of the conductor foil that constitutes the back-side circuit pattern. With this configuration, even when a back-side circuit pattern is interposed between the lower surface of the circuit board 2 and the adhesive sheet 6, the upper surface of the terminal conductor foil 24 and the upper surfaces of the two bus bars 31 and 32 can be made substantially flush with each other.

Operations and Advantageous Effects

With the circuit assembly according to Embodiment 2, because the terminal conductor foil 24 includes the conductor foil recess portion 241, the height difference between the upper surface of the terminal conductor foil 24 and the upper surfaces of the two bus bars 31 and 32 can be reduced. Particularly when the depth of the conductor foil recess portion 241 is set to the same value as the thickness of the adhesive sheet 6, the height difference can be substantially eliminated, and the upper surface of the terminal conductor foil 24 and the upper surfaces of the two bus bars 31 and 32 can be made substantially flush with each other.

Embodiment 3

Figure 6:
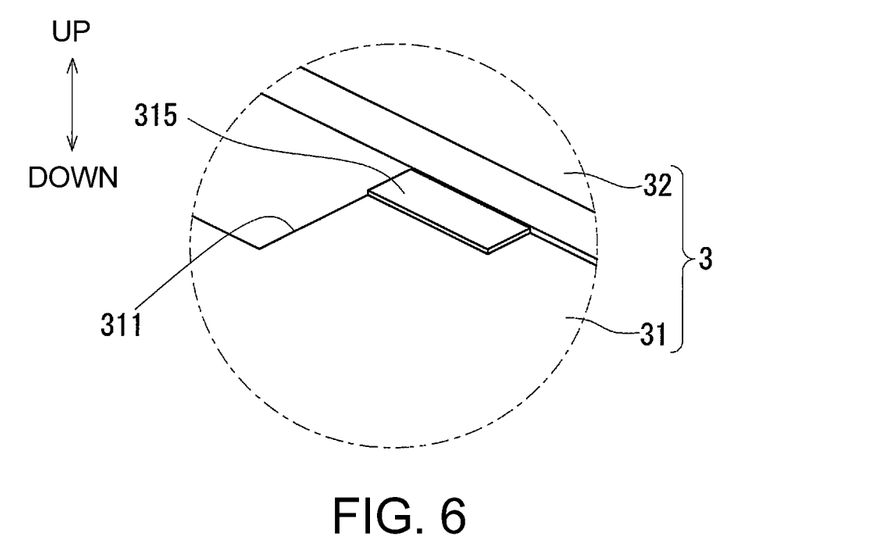
FIG. 6 is a partially enlarged perspective view of a bus bar included in a circuit assembly according to Embodiment 3.
Figure 7:
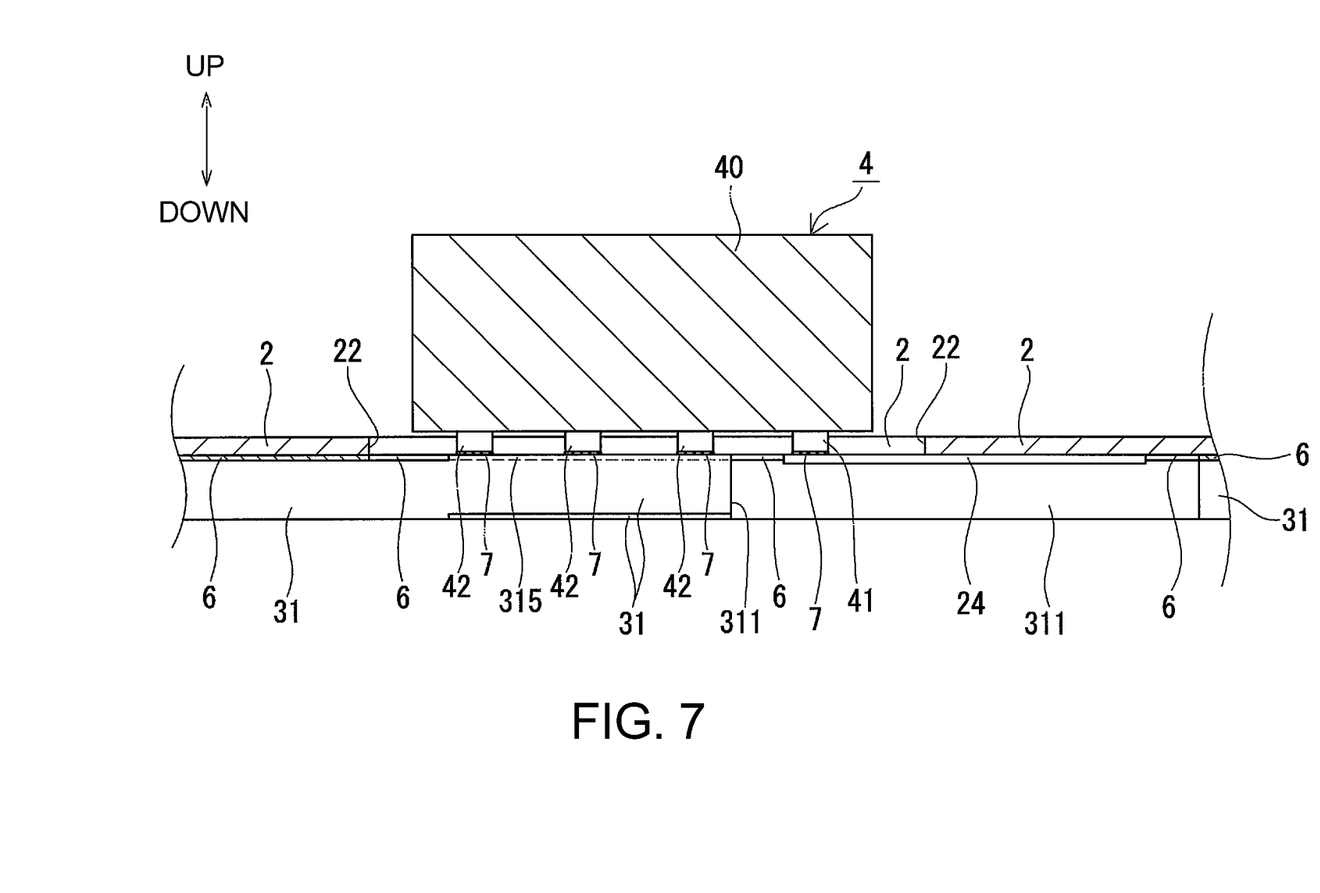
FIG. 7 is a partial cross sectional view of the circuit assembly according to Embodiment 3, taken along a cutting line that divides two adjacent bus bars.

A circuit assembly according to Embodiment 3 will be described with reference to FIGS. 6 and 7. The circuit assembly according to Embodiment 3 is different from the circuit assembly 1A according to Embodiment 1 in that the two bus bars 31 and 32 each include a bus bar projection portion 315. In the diagrams, only the bus bar projection portion 315 of the first bus bar 31 is shown, and illustration of the bus bar projection portion of the second bus bar 32 is omitted. FIG. 6 is an enlarged view of an area of the two bus bars 31 and 32 that faces the placement through hole 22 (the area to which the terminal of the electronic component 4 is connected). For the sake of convenience of the description, other members such as the terminal conductor foil 24 are omitted. FIG. 7 is a cross sectional view of the circuit assembly, taken along a cutting line that divides the two adjacent bus bars, as in FIGS. 3 and 5.

Bus Bar

The bus bar projection portion 315 of the bus bars 3 (31 or 32) reduces the height difference between the upper surface of the bus bars 3 (31 or 32) and the upper surface of the terminal conductor foil 24 in the vertical direction. The bus bar projection portion 315 is formed so as to locally protrude toward the upper surface in a region in the upper surface of the bus bar 31 or 32 that faces the placement through hole 22. That is, the bus bar projection portions 315 are respectively formed in a bonding region in the upper surface of the bus bar 31 to which the second terminals 42 of the electronic component 4 are bonded, and a bonding region in the upper surface of the bus bar 32 to which the third terminal of the electronic component 4 is bonded. The height (the length extending in the vertical direction) of each bus bar projection portion 315 may be set to be the same value as the thickness of the adhesive sheet 6, as with the conductor foil recess portion 241 described above. With this configuration, the upper surface of the terminal conductor foil 24 and the upper surface of the bus bars 3 (31 or 32) can be easily made substantially flush with each other. The bus bar projection portion 315 can be formed by punching from its lower surface side toward its upper surface side using a punch, or thinning a region in the upper surface of the bus bars 3 other than the bus bar projection portion 315 through grinding.

Circuit Board

In the circuit assembly, as with the circuit assembly according to Embodiment 2, in addition to the terminal conductor foil 24, a back-side circuit pattern may be formed on the lower surface of the circuit board 2. In this case, the height of the bus bar projection portion 315 may be set to the same value as the total thickness of the thickness of the adhesive sheet 6 and the thickness of the terminal conductor foil 24. With this configuration, as in Embodiment 2, even when a back-side circuit pattern is interposed between the lower surface of the circuit board 2 and the adhesive sheet 6, the upper surface of the terminal conductor foil 24 and the upper surfaces of the two bus bars 31 and 32 can be made substantially flush with each other.

Operations and Advantageous Effects

With the circuit assembly according to Embodiment 3, because the two bus bars 31 and 32 each have the bus bar projection portion 315, as in Embodiment 2, the height difference between the upper surface of the terminal conductor foil 24 and the upper surfaces of the two bus bars 31 and 32 can be reduced. Particularly when the height of the bus bar projection portion 315 is set to be the same value as the thickness of the adhesive sheet 6, the height difference can be substantially eliminated, and the upper surface of the terminal conductor foil 24 and the upper surfaces of the two bus bars 31 and 32 can be made substantially flush with each other.

Variation 1

A circuit assembly according to Variation 1 is different from the circuit assembly 1A according to Embodiment 1 in that, although not shown in the diagrams, the bus bar recess portion of the first bus bar is formed by punching or thinning instead of cutting-out.

Bus Bar

As with the bus bar cutout portion 311 (FIG. 2), as a result of the terminal conductor foil being fitted, the bus bar recess portion of the first bus bar reduces the height difference between the upper surfaces of the two bus bars and the upper surface of the terminal conductor foil. The size of the bus bar recess portion is larger than that of the terminal conductor foil, as with the bus bar cutout portion 311 (FIG. 2). The depth of the bus bar recess portion can be set to be greater than or equal to the thickness of the adhesive sheet 6 (FIG. 2). The bus bar recess portion can be formed by punching the first bus bar from the upper surface side toward the lower surface using a punch, cutting the upper surface of the first bus bar, or the like. In the case where the bus bar recess portion is formed by punching, in an area that constitutes the lower surface of the bus bar recess portion, a protruding portion that protrudes downward below the peripheral region. On the other hand, in the case where the bus bar recess portion is formed by cutting or the like, in an area that constitutes the lower surface of the bus bar recess portion, a thinly-formed portion that is thinner than the peripheral region is formed. In this case, the lower surface of the first bus bar is flat. The thickness of the thinly-formed portion is preferably set such that the depth of the bus bar recess portion is greater than or equal to the thickness of the adhesive sheet 6, and the strength of the thinly-formed portion is not imp aired.

The present disclosure is not limited to these examples given here.

The invention claimed is:

1. A circuit board for use with an electronic component, the circuit board comprising:
a substrate that has an upper surface on which a circuit pattern is formed, and a lower surface to which a plurality of bus bars that are spaced apart are fixed;
a placement through hole that extends through the upper surface and the lower surface and faces a bus bar of the plurality of bus bars and in which the electronic component is placed; and
a terminal conductor foil that is provided on the lower surface of the substrate and which protrudes inward into the placement through hole, the terminal conductor foil being connected to the electronic component through the placement through hole.

2. A circuit assembly comprising:
a circuit board that has an upper surface on which a circuit pattern is formed;
a plurality of bus bars that are connected to the circuit board, the plurality of bus bars being spaced apart and fixed to a lower surface of the circuit board; and
an electronic component that is placed on a bus bar of the plurality of bus bars, wherein
the circuit board includes:
a placement through hole that extends through the upper surface and the lower surface and faces the bus bar, and in which the electronic component is placed; and
a terminal conductor foil that is provided on the lower surface of the substrate and which protrudes inward into the placement through hole, the terminal conductor foil being connected to the electronic component through the placement through hole.

3. The circuit assembly according to claim 2, wherein the plurality of bus bars include a bus bar recess that reduces a height difference between an upper surface of the plurality of bus bars and an upper surface of the terminal conductor foil on the upper surface of the plurality of bus bars as a result of the terminal conductor foil being fitted.

4. The circuit assembly according to claim 2, wherein the terminal conductor foil includes a conductor foil recess that reduces a height difference between an upper surface of the plurality of bus bars and an upper surface of the terminal conductor foil, the conductor foil recess being formed by depressing, toward the lower surface, a bonding region in the upper surface of the terminal conductor foil to which the terminal of the electronic component is bonded.

5. The circuit assembly according to claim 2, wherein the plurality of bus bars include a bus bar projection that reduces a height difference between an upper surface of the plurality of bus bars and an upper surface of the terminal conductor foil, the bus bar projection being formed so as to locally protrude toward the upper surface in a region in the upper surface of the plurality of bus bars that faces the placement through hole.

6. A circuit board manufacturing method for use with an electronic component, the circuit board manufacturing method comprising:
preparing a stacked plate that has upper and lower surfaces on each of which a conductor foil is stacked;
performing hole forming processing on the stacked plate so as to form a through hole that extends through the upper and lower surfaces, the conductor foil being provided on the lower surface of the substrate such that the conductor foil protrudes inward into the through hole;

forming a protrusion that protrudes inward into the through hole from the lower surface by causing a portion of the conductor foil on the lower surface of the stacked plate to remain in the through hole; and connecting the terminal conductor foil to the electronic component through the through hole.

7. A circuit board manufacturing method for use with an electronic component, the circuit board manufacturing method comprising:

preparing a perforated stacked plate that has an upper surface on which a conductor foil is stacked, and a through hole that extends through upper and lower surfaces of the perforated stacked plate;

bonding a conductor foil to the lower surface of the perforated stacked plate so as to cover the through hole, the conductor foil being provided on the lower surface of the substrate such that the conductor foil protrudes inward into the through hole;

melting and removing a portion of the conductor foil that covers the through hole, and thereby forming a protrusion that protrudes inward into the through hole from the lower surface; and connecting the terminal conductor foil to the electronic component through the through hole.

* * * * *